United States Patent
Do et al.

(10) Patent No.: US 9,275,748 B2
(45) Date of Patent: Mar. 1, 2016

(54) LOW LEAKAGE, LOW THRESHOLD VOLTAGE, SPLIT-GATE FLASH CELL OPERATION

(71) Applicant: Silicon Storage Technology, Inc., San Jose, CA (US)

(72) Inventors: Nhan Do, Saratoga, CA (US); Steven Malcolm Lemke, Boulder Creek, CA (US); Jinho Kim, Saratoga, CA (US); Jong-Won Yoo, Cupertino, CA (US); Alexander Kotov, San Jose, CA (US); Yuri Tkachev, Sunnyvale, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 44 days.

(21) Appl. No.: 14/190,010

(22) Filed: Feb. 25, 2014

(65) Prior Publication Data
US 2014/0269062 A1 Sep. 18, 2014

Related U.S. Application Data

(60) Provisional application No. 61/784,912, filed on Mar. 14, 2013.

(51) Int. Cl.
| | |
|---|---|
| *G11C 16/26* | (2006.01) |
| *G11C 16/14* | (2006.01) |
| *G11C 16/04* | (2006.01) |
| *H01L 21/28* | (2006.01) |
| *H01L 29/788* | (2006.01) |
| *H01L 27/115* | (2006.01) |
| *H01L 29/423* | (2006.01) |

(52) U.S. Cl.
CPC ............ *G11C 16/26* (2013.01); *G11C 16/0408* (2013.01); *G11C 16/0425* (2013.01); *G11C 16/14* (2013.01); *H01L 21/28273* (2013.01); *H01L 27/11521* (2013.01); *H01L 29/42328* (2013.01); *H01L 29/7881* (2013.01); *G11C 16/0433* (2013.01)

(58) Field of Classification Search
CPC ..... G11C 16/26; G11C 16/0408; G11C 16/14
USPC ...................................... 365/185.05
See application file for complete search history.

(56) References Cited

U.S. PATENT DOCUMENTS

| | | | |
|---|---|---|---|
| 7,927,994 B1 | 4/2011 | Liu et al. | |
| 2005/0207199 A1 | 9/2005 | Chen | |
| 2008/0251832 A1 | 10/2008 | Chih | |
| 2009/0310411 A1* | 12/2009 | Lee et al. | 365/185.11 |
| 2009/0316487 A1* | 12/2009 | Lee et al. | 365/185.22 |
| 2010/0290292 A1 | 11/2010 | Tanizaki | |
| 2011/0316060 A1 | 12/2011 | Yao | |
| 2012/0087188 A1* | 4/2012 | Hsieh et al. | 365/185.05 |

OTHER PUBLICATIONS

PCT International Search Report and Written Opinion dated Jul. 2, 2014 in connection with the related PCT Patent Application No. US14/019230.

* cited by examiner

*Primary Examiner* — Hoai V Ho
*Assistant Examiner* — Tri Hoang
(74) *Attorney, Agent, or Firm* — DLA Piper LLP (US)

(57) ABSTRACT

A method of reading a memory device having rows and columns of memory cells formed on a substrate, where each memory cell includes spaced apart first and second regions with a channel region therebetween, a floating gate disposed over a first portion of the channel region, a select gate disposed over a second portion of the channel region, a control gate disposed over the floating gate, and an erase gate disposed over the first region. The method includes placing a small positive voltage on the unselected source lines, and/or a small negative voltage on the unselected word lines, during the read operation to suppress sub-threshold leakage and thereby improve read performance.

18 Claims, 2 Drawing Sheets

LOW LEAKAGE, LOW THRESHOLD VOLTAGE, SPLIT-GATE FLASH CELL OPERATION

RELATED APPLICATIONS

This application claims the benefit of U.S. Provisional Application No. 61/784,912, filed Mar. 14, 2013, and which is incorporated herein by reference.

FIELD OF THE INVENTION

The present invention relates to the operation of split-gate non-volatile memory cells.

BACKGROUND OF THE INVENTION

The structure, formation and operation of split gate non-volatile memory cell devices are known. For example, U.S. Pat. No. 7,927,994 discloses a split gate non-volatile memory cell device and its operation, and is incorporated herein by reference for all purposes. This split gate memory cell device include an array of memory cells arranged in rows and columns. FIG. 1 illustrates a pair of such memory cells formed on a semiconductor substrate 12. Source and drain diffusion regions 16/14 are formed in the substrate 12, defining a channel region 18 therebetween. Each of the memory cells has four conductive gates: a select gate 20 disposed over and insulated from a first portion of the channel region 18, a floating gate 22 disposed over and insulated from a second portion of the channel region 18 and a portion of the source region 16, an erase gate 24 disposed over and insulated from the source region 16, and a control gate 26 disposed over and insulated from the floating gate 22. Preferably, the erase gate 24 can have an upper portion that is disposed vertically over the floating gate 22 (e.g. a vertical overhang).

The memory cells are arranged in an array, with columns of such memory cells separated by columns of isolation regions in an interlaced fashion. Each column of memory cells contains pairs of the memory cells in FIG. 1 arranged end to end, whereby each pair of memory cells share the same source region 16, and adjacent pairs share the same drain region 14. The select gates 20 for an entire row of the memory cells are formed as a single conductive line (commonly referred to as a word line WL), such that each word line forms the select gate 20 for one of the memory cells in each column of the memory cells (i.e. each word line electrically connects together a row of the select gates 20). The control gates 26 are similarly formed as a continuous control gate line extending along the row of memory cells (i.e. electrically connecting together a row of the control gates 26), and the erase gates 24 are also similarly formed as a continuous erase gate line extending along the row of memory cells (i.e. electrically connecting together a row of the erase gates 24). The source regions 16 are also continuously formed as a source line SL that extends in the row direction and serves at the source regions 16 for the entire row of memory cell pairs (i.e. electrically connecting together a row of the source regions 16). Conductive bit line contacts 72 electrically connect the drains 14 to a bit line 70, whereby each column of drain regions 14 are electrically connected together by a bit line 70. FIG. 2 illustrates a schematic representation of a portion of the memory array.

An individual target memory cell can be erased, programmed and read by applying various voltages to the selected lines for the target memory cell (i.e. the word line 20, bit line 70, source line 16, control gate line 26 and erase gate line 24 associated with the targeted memory cell), and by applying various voltages to the unselected lines (i.e. the word lines 20, bit lines 70, source lines 16, control gate lines 26 and erase gate lines 24 not associated with the targeted memory cell).

For example, for erase operation, the following voltages may be applied to the selected (Sel.) lines and unselected (Unsel.) lines:

| WL (20) | | BL (70) | | SL (16) | | CG (26) | | EG (24) | |
|---|---|---|---|---|---|---|---|---|---|
| Sel. | Unsel. | Sel. | Unsel. | Sel. | Unsel. | Sel. | Unsel. | Sel. | Unsel. |
| 0 v | 0 v | 0 v | 0 v | 0 v | 0 v | 0 v or −6 to −9 v | 0 v | 9-11 v or 7-9 v | 0 v |

During erase, a voltage of 9-11 volts is applied to the erase gate 24, to cause electrons to tunnel from the floating gate 22 to the erase gate 24. A negative voltage on the order of −6 to −9 volts may be applied to the selected control gate 26. In that event, the voltage applied to the selected erase gate 24 may be lowered to approximately 7-9 volts. It is also known to use a voltage of 11.5 volts on the selected erase gate line 24, with zero voltages on all other lines.

For programming, the following voltages may be applied to the selected (Sel.) lines and unselected (Unsel.) lines:

| WL (20) | | BL (70) | | SL (16) | | CG (26) | | EG (24) | |
|---|---|---|---|---|---|---|---|---|---|
| Sel. | Unsel. | Sel. | Unsel. | Sel. | Unsel. | Sel. | Unsel. | Sel. | Unsel. |
| 1-2 v | 0 v | 0.5-5 uA | 1.5-3 v | 3-6 v | 0 v | 6-9 v | 0 v | 6-9 v | 0 v |

During programming, the target memory cell is programmed through efficient hot-electron injection with the portion of the channel under the floating gate in inversion. The medium voltage of 3-6 volts is applied to the selected source line SL to generate the hot electrons. The selected control gate 26 and erase gate 24 are biased to a high voltage (6-9 volts) to utilize the high coupling ratio and to maximize the voltage coupling to the floating gate 22. The high voltage coupled to the floating gate induces FG channel inversion and concentrates lateral field in the split area to generate hot electrons more effectively, which are injected onto the floating gate 22. In addition, the voltages provide a high vertical field to attract hot electron into the floating gate and reduce injection energy barrier.

It is also known to use the following combination of programming voltages:

| WL (20) | | BL (70) | | SL (16) | | CG (26) | | EG (24) | |
|---|---|---|---|---|---|---|---|---|---|
| Sel. | Unsel. | Sel. | Unsel. | Sel. | Unsel. | Sel. | Unsel. | Sel. | Unsel. |
| 0.8 v | 0 v | 1.0 uA | >1.08 v | 4.5 v | 0.5 v | 10.5 v | 0-2.5 v | 4.5 v | 0.5 v |

For reading, the following voltages may be applied to the selected (Sel.) lines and unselected (Unsel.) lines:

| WL (20) | | BL (70) | | SL (16) | | CG (26) | | EG (24) | |
|---|---|---|---|---|---|---|---|---|---|
| Sel. | Unsel. | Sel. | Unsel. | Sel. | Unsel. | Sel. | Unsel. | Sel. | Unsel. |
| 1.5-3.7 v | 0 v | 0.5-1.5 v | 0 v | 0 v | 0 v | 0 v-3.7 V | 0 v | 0 v-3.7 V | 0 v |

During a read operation, depending upon the balance between program and read operations, the voltages on the selected control gate 26 and the selected erase gate 24 can be balanced because each is coupled to the floating gate. Thus, the voltages applied to each of the selected control gate 26 and selected erase gate 24 can be a combination of voltages ranging from 0 to 3.7 volts to achieve optimum window. In addition, because the voltage on the selected control gate 26 is unfavorable due to the RC coupling, voltages on the selected erase gate 24 can result in a faster read operation. It is also known in a read operation to apply a voltage of 1.2 volts on the selected word line and a voltage of 2.5 volts on the unselected control gate 26. During a read operation, the voltage on the select gate turns on (makes conductive) the portion of the channel region under the select gate 20. If the floating gate is programmed with electrons, the portion of the channel region under the floating gate will not conduct or provide little conduction. If the floating gate is not programmed with electrons, the channel region under the floating gate will be conductive. The conductivity of the channel region is sensed to determine if the floating gate is programmed with electrons or not.

As the memory cells are scaled down in size, the cell current is reduced, which can result in read errors. One option to increase cell current is to reduce the memory cell threshold voltage WLVT. However, lowering WLVT would increase column leakage current, which may cause programming errors. Therefore, there is a need to improve read performance and reliability without necessarily changing the memory cell threshold voltage WLVT.

BRIEF SUMMARY OF THE INVENTION

An improved method of reading a memory device having rows and columns of memory cells formed on a substrate of semiconductor material having a first conductivity type:
wherein each of the memory cells comprises:
spaced apart first and second regions formed in the substrate and having a second conductivity type different than the first conductivity type, wherein a channel region of the substrate is disposed between the first and second regions,
a floating gate disposed over and insulated from a first portion of the channel region,
a select gate disposed over and insulated from a second portion of the channel region,
a control gate disposed over and insulated from the floating gate, and
an erase gate disposed over and insulated from the first region;
wherein the memory device further comprises:
a plurality of word lines each electrically connecting together a row of the select gates,
a plurality of bit lines each electrically connecting together a column of the second regions,
a plurality of source lines each electrically connecting together a row of the first regions,
a plurality of control gate lines each electrically connecting together a row of the control gates, and
a plurality of erase gate lines each electrically connecting together a row of the erase gates;
wherein the method of reading the memory device comprises:
applying a positive voltage to one of the word lines which is associated with a target memory cell, and applying a zero voltage to all the other word lines;
applying a positive voltage to one of the bit lines which is associated with the target memory cell, and applying a zero voltage to all the other bit lines; and
applying a zero voltage to one of the source lines which is associated with the target memory cell, and applying a positive voltage to all the other source lines.

In another aspect of the present invention, a method of reading a memory device having rows and columns of memory cells formed on a substrate of semiconductor material having a first conductivity type:
wherein each of the memory cells comprises:
spaced apart first and second regions formed in the substrate and having a second conductivity type different than the first conductivity type, wherein a channel region of the substrate is disposed between the first and second regions,
a floating gate disposed over and insulated from a first portion of the channel region,
a select gate disposed over and insulated from a second portion of the channel region,
a control gate disposed over and insulated from the floating gate, and
an erase gate disposed over and insulated from the first region;
wherein the memory device further comprises:
a plurality of word lines each electrically connecting together a row of the select gates,
a plurality of bit lines each electrically connecting together a column of the second regions, a plurality of source lines each electrically connecting together a row of the first regions, a plurality of control gate lines each electrically connecting together a row of the control gates, and a plurality of erase gate lines each electrically connecting together a row of the erase gates;

wherein the method of reading the memory device comprises:

applying a positive voltage to one of the word lines which is associated with a target memory cell, and applying a negative voltage to all the other word lines;

applying a positive voltage to one of the bit lines which is associated with the target memory cell, and applying a zero voltage to all the other bit lines; and applying a zero voltage to the source lines.

In yet another aspect of the present invention, a method of reading a memory device having rows and columns of memory cells formed on a substrate of semiconductor material having a first conductivity type:

wherein each of the memory cells comprises:

spaced apart first and second regions formed in the substrate and having a second conductivity type different than the first conductivity type, wherein a channel region of the substrate is disposed between the first and second regions, a floating gate disposed over and insulated from a first portion of the channel region, a select gate disposed over and insulated from a second portion of the channel region, a control gate disposed over and insulated from the floating gate, and an erase gate disposed over and insulated from the first region;

wherein the memory device further comprises:

a plurality of word lines each electrically connecting together a row of the select gates, a plurality of bit lines each electrically connecting together a column of the second regions, a plurality of source lines each electrically connecting together a row of the first regions, a plurality of control gate lines each electrically connecting together a row of the control gates, and a plurality of erase gate lines each electrically connecting together a row of the erase gates;

wherein the method of reading the memory device comprises:

applying a positive voltage to one of the word lines which is associated with a target memory cell, and applying a negative voltage to all the other word lines;

applying a positive voltage to one of the bit lines which is associated with the target memory cell, and applying a zero voltage to all the other bit lines; and applying a zero voltage to one of the source lines which is associated with the target memory cell, and applying a positive voltage to all the other source lines.

Other objects and features of the present invention will become apparent by a review of the specification, claims and appended figures.

DETAILED DESCRIPTION OF THE INVENTION

Figure 1:
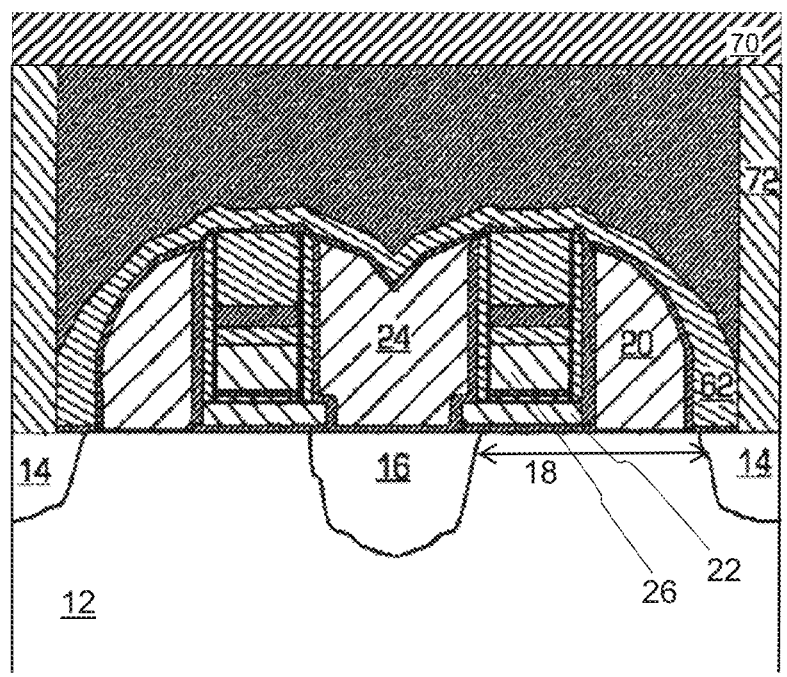
FIG. 1 is a side cross sectional view of conventional memory cells applicable to the present invention.
Figure 2:
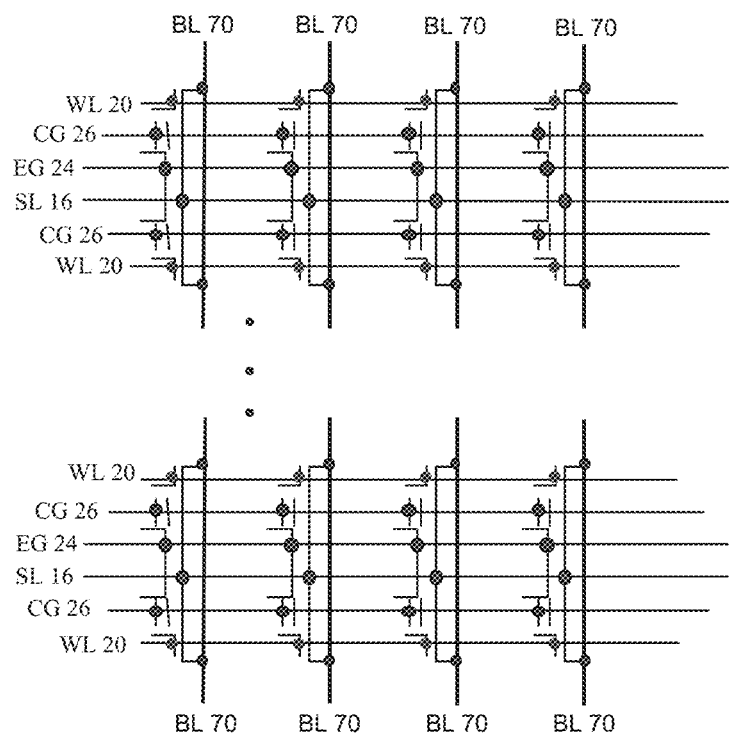
FIG. 2 is a schematic diagram of a portion of the memory array.

The present invention is an improved technique of reading an array of non-volatile memory cells of the type illustrated in FIGS. 1 and 2. It has been discovered that placing a small positive voltage on the unselected source lines SL, and/or a small negative voltage on the unselected word lines WL, during the read operation suppresses sub-threshold leakage and thereby improves read performance.

In a first embodiment, during a read operation, a small positive voltage (e.g. ~0.1V to 0.5V, such as 0.2V) is placed on the unselected source lines 20, in addition to the other voltages discussed above with respect to the read operation, as illustrated below:

| WL (20) | | BL (70) | | SL (16) | | CG (26) | | EG (24) | |
|---|---|---|---|---|---|---|---|---|---|
| Sel. | Unsel. | Sel. | Unsel. | Sel. | Unsel. | Sel. | Unsel. | Sel. | Unsel. |
| 1.2-3.7 v | 0 v | 0.5-1.5 v | 0 v | 0 v | 0.1-0.5 v | 0 v-3.7 v | 0 v-2.5 v | 0 v-3.7 v | 0 v |

The small positive voltage on the unselected source lines suppresses subthreshold leakage for the memory cells along those source lines. Only the subthreshold leakage of the memory cells along the selected source line dominates the column leakage during a read operation. This will overall significantly reduce the column leakage, where most of memory cells are biased with the small source bias. Reduction of such column leakage will reduce or eliminate programming errors during the read operation.

Preferred exemplary, but not limiting, voltages for this first embodiment can be as follows:

| WL (20) | | BL (70) | | SL (16) | | CG (26) | | EG (24) | |
|---|---|---|---|---|---|---|---|---|---|
| Sel. | Unsel. | Sel. | Unsel. | Sel. | Unsel. | Sel. | Unsel. | Sel. | Unsel. |
| 1.2 v | 0 v | 0.6 v | 0 v | 0 v | 0.2 v | 2.5 v | 2.5 v | 0 v | 0 v |

In a second embodiment, during a read operation, a small negative voltage (e.g. ~−0.1V to −0.5V, such as −0.2V) is placed on the unselected word lines, in addition to the other voltages discussed above with respect to the read operation, as illustrated below:

| WL (20) | | BL (70) | | SL (16) | | CG (26) | | EG (24) | |
|---|---|---|---|---|---|---|---|---|---|
| Sel. | Unsel. | Sel. | Unsel. | Sel. | Unsel. | Sel. | Unsel. | Sel. | Unsel. |
| 1.2-3.7 v | −0.1 to −0.5 v | 0.5-1.5 v | 0 v | 0 v | 0 v | 0 v-3.7 v | 0-2.5 v | 0 v-3.7 v | 0 v |

The small negative voltage on the unselected word lines suppresses subthreshold leakage for the memory cells along those source lines. Only the subthreshold leakage of the memory cells in the selected row dominates the column leakage during a read operation. This will overall significantly reduce the column leakage, where all the unselected memory cells are biased with the small negative word line bias. Reduction of such column leakage will reduce or eliminate programming errors during the read operation.

Preferred exemplary, but not limiting, voltages for this second embodiment can be as follows:

| WL (20) | | BL (70) | | SL (16) | | CG (26) | | EG (24) | |
|---|---|---|---|---|---|---|---|---|---|
| Sel. | Unsel. | Sel. | Unsel. | Sel. | Unsel. | Sel. | Unsel. | Sel. | Unsel. |
| 1.2 v | −0.2 v | 0.6 v | 0 v | 0 v | 0 v | 2.5 v | 2.5 v | 0 v | 0 v |

In a third embodiment, the low positive voltage for the unselected source lines of the first embodiment and the low negative voltage for the unselected word lines of the second embodiment are both applied during the read operation, as illustrated below:

| WL (20) | | BL (70) | | SL (16) | | CG (26) | | EG (24) | |
|---|---|---|---|---|---|---|---|---|---|
| Sel. | Unsel. | Sel. | Unsel. | Sel. | Unsel. | Sel. | Unsel. | Sel. | Unsel. |
| 1.2-3.7 v | −0.1 to −0.5 v | 0.5-1.5 v | 0 v | 0 v | 0.1-0.5 v | 0 v-3.7 v | 0-2.5 v | 0 v-3.7 v | 0 v |

The magnitude of these two voltages (on the unselected source lines and unselected word lines) in this third embodiment necessary to achieve optimum results may be less than if just one of these voltages were to be applied as in the first or second embodiments.

Preferred exemplary, but not limiting, voltages for this third embodiment can be as follows:

| WL (20) | | BL (70) | | SL (16) | | CG (26) | | EG (24) | |
|---|---|---|---|---|---|---|---|---|---|
| Sel. | Unsel. | Sel. | Unsel. | Sel. | Unsel. | Sel. | Unsel. | Sel. | Unsel. |
| 1.2 v | −0.2 v | 0.6 v | 0 v | 0 v | 0.2 v | 2.5 v | 2.5 v | 0 v | 0 v |

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of reading a memory device having rows and columns of memory cells formed on a substrate of semiconductor material having a first conductivity type:
   wherein each of the memory cells comprises:
   spaced apart first and second regions formed in the substrate and having a second conductivity type different than the first conductivity type, wherein a channel region of the substrate is disposed between the first and second regions,
   a floating gate disposed over and insulated from a first portion of the channel region, a select gate disposed over and insulated from a second portion of the channel region, a control gate disposed over and insulated from the floating gate, and an erase gate disposed over and insulated from the first region;

wherein the memory device further comprises:

a plurality of word lines each electrically connecting together a row of the select gates, a plurality of bit lines each electrically connecting together a column of the second regions, a plurality of source lines each electrically connecting together a row of the first regions, a plurality of control gate lines each electrically connecting together a row of the control gates, and a plurality of erase gate lines each electrically connecting together a row of the erase gates;

wherein the method of reading the memory device comprises:

applying a positive voltage to one of the word lines which is associated with a target memory cell, and applying a zero voltage to all the other word lines;

applying a positive voltage to one of the bit lines which is associated with the target memory cell, and applying a zero voltage to all the other bit lines; and applying a zero voltage to one of the source lines which is associated with the target memory cell, and applying a positive voltage to all the other source lines.

2. The method of claim 1, further comprising:

applying a zero or positive voltage to one of the control gate lines which is associated with the target memory cell, and applying a zero or positive voltage to all the other control gate lines; and applying a zero or positive voltage to one of the erase gate lines which is associated with the target memory cell, and applying a zero voltage to all the other erase gate lines.

3. The method of claim 1, wherein:

the positive voltage applied to the word line associated with the target memory cell is 1.2 to 3.7 volts;

the positive voltage applied to the bit line associated with the target memory cell is 0.5 to 1.5 volts;

the positive voltage applied to the all other source lines is 0.1 to 0.5 volts.

4. The method of claim 3, wherein:

the positive voltage applied to the word line associated with the target memory cell is substantially 1.2 volts;

the positive voltage applied to the bit line associated with the target memory cell is substantially 0.6 volts; and the positive voltage applied to the all other source lines is substantially 0.2 volts.

5. The method of claim 4, further comprising:

applying substantially 2.5 volts to the control gate lines.

6. The method of claim 5, further comprising:

applying a zero voltage to the erase gate lines.

7. A method of reading a memory device having rows and columns of memory cells formed on a substrate of semiconductor material having a first conductivity type:

wherein each of the memory cells comprises:

spaced apart first and second regions formed in the substrate and having a second conductivity type different than the first conductivity type, wherein a channel region of the substrate is disposed between the first and second regions, a floating gate disposed over and insulated from a first portion of the channel region, a select gate disposed over and insulated from a second portion of the channel region, a control gate disposed over and insulated from the floating gate, and an erase gate disposed over and insulated from the first region;

wherein the memory device further comprises:

a plurality of word lines each electrically connecting together a row of the select gates, a plurality of bit lines each electrically connecting together a column of the second regions, a plurality of source lines each electrically connecting together a row of the first regions, a plurality of control gate lines each electrically connecting together a row of the control gates, and a plurality of erase gate lines each electrically connecting together a row of the erase gates;

wherein the method of reading the memory device comprises:

applying a positive voltage to one of the word lines which is associated with a target memory cell, and applying a negative voltage to all the other word lines;

applying a positive voltage to one of the bit lines which is associated with the target memory cell, and applying a zero voltage to all the other bit lines; and applying a zero voltage to the source lines; and applying a zero or positive voltage to one of the control gate lines which is associated with the target memory cell, and applying a positive voltage to all the other control gate lines.

8. The method of claim 7, further comprising:

applying a zero or positive voltage to one of the erase gate lines which is associated with the target memory cell, and applying a zero voltage to all the other erase gate lines.

9. The method of claim 7, wherein:

the positive voltage applied to the word line associated with the target memory cell is 1.2 to 3.7 volts;

the positive voltage applied to the bit line associated with the target memory cell is 0.5 to 1.5 volts;

the negative voltage applied to the all other word lines is −0.1 to −0.5 volts.

10. The method of claim 9, wherein:

the positive voltage applied to the word line associated with the target memory cell is substantially 1.2 volts;

the positive voltage applied to the bit line associated with the target memory cell is substantially 0.6 volts; and the negative voltage applied to the all other word lines is substantially −0.2 volts.

11. The method of claim 10, further comprising:

applying substantially 2.5 volts to the control gate lines.

12. The method of claim 11, further comprising:

applying a zero voltage to the erase gate lines.

13. A method of reading a memory device having rows and columns of memory cells formed on a substrate of semiconductor material having a first conductivity type:

wherein each of the memory cells comprises:

spaced apart first and second regions formed in the substrate and having a second conductivity type different than the first conductivity type, wherein a channel region of the substrate is disposed between the first and second regions, a floating gate disposed over and insulated from a first portion of the channel region, a select gate disposed over and insulated from a second portion of the channel region, a control gate disposed over and insulated from the floating gate, and an erase gate disposed over and insulated from the first region;

wherein the memory device further comprises:

a plurality of word lines each electrically connecting together a row of the select gates, a plurality of bit lines each electrically connecting together a column of the second regions, a plurality of source lines each electrically connecting together a row of the first regions, a plurality of control gate lines each electrically connecting together a row of the control gates, and a plurality of erase gate lines each electrically connecting together a row of the erase gates;

wherein the method of reading the memory device comprises:

applying a positive voltage to one of the word lines which is associated with a target memory cell, and applying a negative voltage to all the other word lines;

applying a positive voltage to one of the bit lines which is associated with the target memory cell, and applying a zero voltage to all the other bit lines; and applying a zero voltage to one of the source lines which is associated with the target memory cell, and applying a positive voltage to all the other source lines.

14. The method of claim 13, further comprising:

applying a zero or positive voltage to one of the control gate lines which is associated with the target memory cell, and applying a zero or positive voltage to all the other control gate lines; and applying a zero or positive voltage to one of the erase gate lines which is associated with the target memory cell, and applying a zero voltage to all the other erase gate lines.

15. The method of claim 13, wherein:

the positive voltage applied to the word line associated with the target memory cell is 1.2 to 3.7 volts;

the positive voltage applied to the bit line associated with the target memory cell is 0.5 to 1.5 volts;

the negative voltage applied to the all other word lines is −0.1 to −0.5 volts; and the positive voltage applied to the all other source lines is 0.1 to 0.5 volts.

16. The method of claim 15, wherein:

the positive voltage applied to the word line associated with the target memory cell is substantially 1.2 volts;

the positive voltage applied to the bit line associated with the target memory cell is substantially 0.6 volts;

the negative voltage applied to the all other word lines is substantially −0.2 volts; and the positive voltage applied to the all other source lines is substantially 0.2 volts.

17. The method of claim 16, further comprising:

applying substantially 2.5 volts to the control gate lines.

18. The method of claim 17, further comprising:

applying a zero voltage to the erase gate lines.

* * * * *